United States Patent
Lee et al.

(10) Patent No.: US 8,202,683 B2
(45) Date of Patent: Jun. 19, 2012

(54) METHOD FOR FORMING PATTERN OF SEMICONDUCTOR DEVICE

(75) Inventors: Ki Lyoung Lee, Gyeonggi-do (KR);
Cheol Kyu Bok, Gyeonggi-do (KR);
Keun Do Ban, Gyeonggi-do (KR)

(73) Assignee: Hynix Semiconductor Inc., Icheon (KR)

( * ) Notice: Subject to any disclaimer, the term of this patent is extended or adjusted under 35 U.S.C. 154(b) by 465 days.

(21) Appl. No.: 12/473,242

(22) Filed: May 27, 2009

(65) Prior Publication Data

US 2010/0248153 A1   Sep. 30, 2010

(30) Foreign Application Priority Data

Mar. 31, 2009   (KR) ........................ 10-2009-0027401

(51) Int. Cl.
*G03F 7/26* (2006.01)
(52) U.S. Cl. ........................................ 430/313; 430/394
(58) Field of Classification Search .................. 430/313, 430/314, 315
See application file for complete search history.

(56) References Cited

U.S. PATENT DOCUMENTS

| | | | |
|---|---|---|---|
| 7,790,531 B2 * | 9/2010 | Tran | 438/157 |
| 2008/0081412 A1 * | 4/2008 | Jung | 438/257 |

FOREIGN PATENT DOCUMENTS

| | | | |
|---|---|---|---|
| JP | 2007235037 A | 9/2007 | |
| JP | 2008117816 A | 5/2008 | |
| KR | 101998053681 A | 9/1998 | |

* cited by examiner

*Primary Examiner* — Kathleen Duda
*Assistant Examiner* — Caleen Sullivan (57) ABSTRACT

A method for forming a pattern of a semiconductor device is provided. Specifically, in a method for manufacturing a NAND flash memory device using a spacer patterning process, a dummy pattern, which is not used in an actual device operation, is additionally formed in a peripheral circuit region when a photoresist pattern for forming a string pattern is formed in a cell region. As a result, the edge photoresist pattern is prevented from being bent, and a critical dimension difference between the center region and the edge region of the photoresist pattern is not generated, thereby improving a margin of DOF to obtain a reliable semiconductor device.

20 Claims, 10 Drawing Sheets

| | | PRIOR ART | PRESENT INVENTION |
|---|---|---|---|
| Center Region of patterns | 90° |  |  |
| | 70° |  |  |
| Edge region of patterns | 90° |  COLLAPSE |  |
| | 70° |  COLLAPSE |  |

METHOD FOR FORMING PATTERN OF SEMICONDUCTOR DEVICE

CROSS-REFERENCE TO RELATED APPLICATION

Priority to Korean patent application number 10-2009-0027401, filed on 31 Mar. 2009, the entire disclosure of which is incorporated by reference, is claimed.

BACKGROUND OF THE INVENTION

The invention relates to a method for forming a pattern of a semiconductor device, and more specifically, to a method for forming a pattern of a semiconductor device that has a profile with reduced distortion in a process for manufacturing a high density flash memory device (e.g., NAND) using a spacer patterning technology.

Recently, a semiconductor technology has been rapidly developed in order to store the ever increasing amount of information, promptly process or transmit information, and construct a simpler information communication network in line with the 21$^{th}$ century information communication society. Particularly, due to rapid popularization of information media such as computers, ongoing research has focused on development of process equipment or process techniques for manufacturing a semiconductor device that has a large capacity with a low manufacturing cost without degrading electric characteristics while components are fabricated to be smaller has been made.

Particularly, the demand of nonvolatile flash memory devices that can program and erase programs electrically and do not require a refresh function for re-writing data with a given cycle has increased.

Information stored in the cells of the flash memory device is not lost even when power is shut off. Therefore, the flash memory device has been applied to the memory card. Common types of flash memory device includes a NAND flash memory device and a NOR flash memory device.

The NAND flash memory has a cell region and a peripheral circuit region. More specifically, the NAND flash memory device comprises a memory cell array that includes a plurality of bit lines, a plurality of word lines intersected orthogonally with the bit lines, and a plurality of strings. Each string includes a plurality of memory cells, a source select transistor (SST) and a drain select transistor (DST). The SST and DST are connected serially to the memory cells and are used for selecting each string. The drain select transistor is selected by a drain select line (DSL), and the source select transistor is selected by a source select line (SSL). A source of the source select transistor included in each string is grounded by a common source line (CSL). The peripheral circuit region includes a PMOS transistor and a NMOS transistor.

The NOR flash memory device comprises of a plurality of memory cells and a cell region that includes bit lines and common source lines. One memory cell is interposed between the bit line and the common source line. As a result, the NAND flash memory device shows higher integration than the NOR flash memory device, but requires a higher cell current.

As semiconductor devices becomes smaller, it becomes important to control a critical dimension of a pattern. However, it is difficult to form a line/space (L/S) pattern having a critical dimension of less than 40 nm by a single exposing process due to a resolution limit of an ArF exposer used in a current process for forming a pattern of a semiconductor device. Particularly, it is difficult to form a L/S pattern of less than 30 nm with a high index fluid material and an exposure having a high numeral aperture. In order to improve the formation of the L/S pattern, an exposure light source with short wavelength like Extreme Ultra Violet (EUV) (13.4 nm), and an exposer and resist suitable for the light source are being developed. However, they are still insufficient for the manufacturing of semiconductor devices.

As a result, a K1 factor of the conventional exposer is lowered to improve a resolution of a photolithography technology and enlarge a process margin. A double patterning technology is developed with an improved resolution. The double patterning technology includes a double exposing and etching technology and a spacer patterning technology.

The spacer patterning technology is a self-alignment technology that includes a mask process performed once to form a pattern, thereby preventing mis-alignment. The spacer patterning technology includes a positive method and a negative method.

The positive spacer patterning method comprises: forming a mask pattern for a word line over an underlying layer of a cell region; etching the underlying layer with the mask pattern as an etching mask to form a partition; forming a spacer pattern at sidewalls of the partition; performing a cutting mask process for removing the partition and separating the line end portion of the spacer pattern; and forming a pad pattern in core and peripheral regions. As a result, the process steps of the positive spacer patterning method are complicated. Moreover, since the spacer pattern having an asymmetrical structure is used as an etching mask, it is difficult to adjust a critical dimension of a lower underlying layer by a difference of an etching process condition.

In order to reduce the process steps and improve the above shortcoming, a simplified spacer patterning method is developed. Hereinafter, FIGS. 1a to 1f show the simplified spacer patterning method in detail.

Figure 1A:
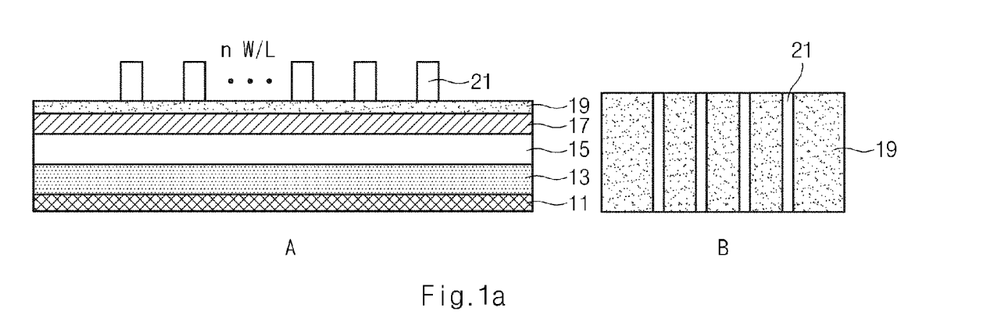
FIGS. 1a to 1f are diagrams illustrating a method for forming a pattern of a semiconductor device according to a conventional spacer patterning process.

An underlying layer 11 that includes a dielectric film (not shown) consisting of an oxide film-nitride film-oxide film (ONO), a gate polysilicon layer (not shown), a tungsten conductive layer (not shown), a capping oxide film (not shown) and a gate mask film (not shown) is formed over a substrate that includes a device isolation film (ISO).

A first mask film 13, a second mask film 15, a third mask film 17 and an antireflection film 19 are sequentially deposited over the underlying layer. The first mask film is selected from the group including an oxide film, and the second mask film includes an amorphous carbon layer.

Referring to FIG. 1a, a photoresist film (not shown) is coated over the antireflection film 19. A photolithography process is performed on the photoresist film using a cell exposure mask. The cell exposure mask includes a light transmitting region having a pitch twice larger than a device pitch, thereby obtaining a first photoresist pattern 21 for a word line. The first photoresist pattern 21 is formed to have n protrusions when the number of final word lines is 2n.

Figure 1B:
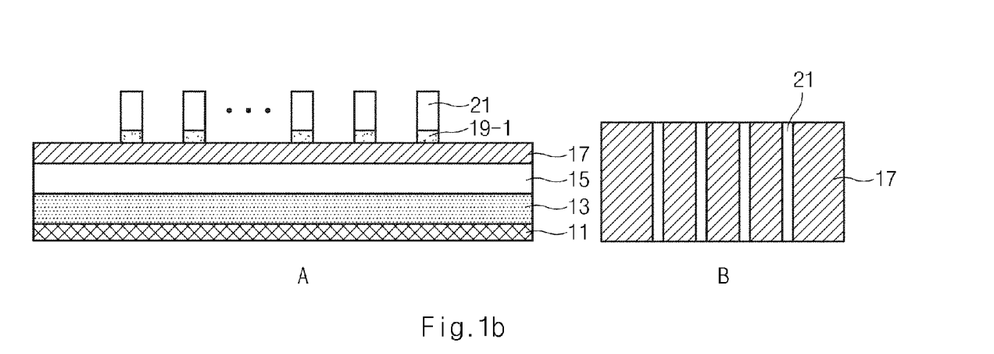

Referring to FIG. 1b, the antireflection film 19 is etched with the first photoresist pattern 21 as an etching mask to form a stack pattern consisting of an antireflection pattern 19-1 and a first photoresist pattern 21.

Figure 1C:
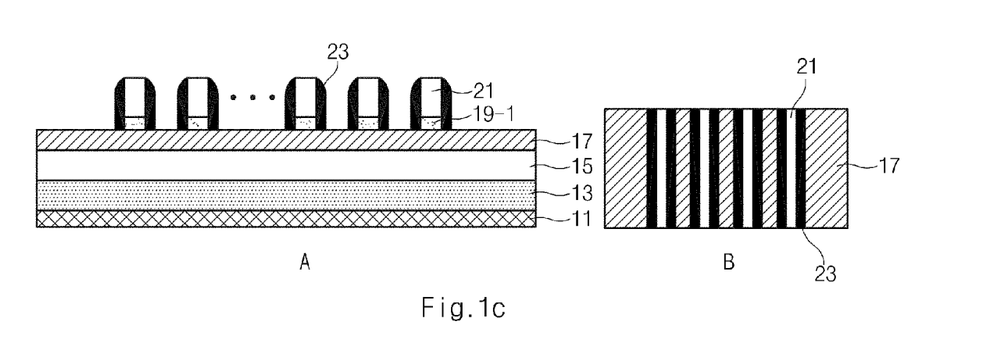

Referring to FIG. 1c, a spacer forming material (not shown) is deposited over substrate comprising the stack pattern. An etch-back process is performed to form a spacer 23 at sidewalls of the stack pattern.

Figure 1D:
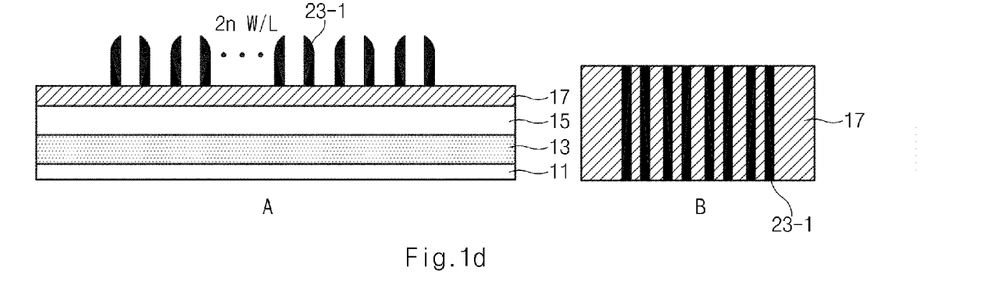

Referring to FIG. 1d, an $O_2$ plasma ashing process is performed on the resulting structure to remove the stack pattern, thereby obtaining 2n spacer patterns 23-1.

A second photoresist pattern (not shown) that exposes the end portion of the spacer pattern 23-1 is formed. An etching process (not shown) for separating the end portions of the spacer patterns 23-1 is performed with the second photoresist pattern as an etching mask.

Figure 1E:
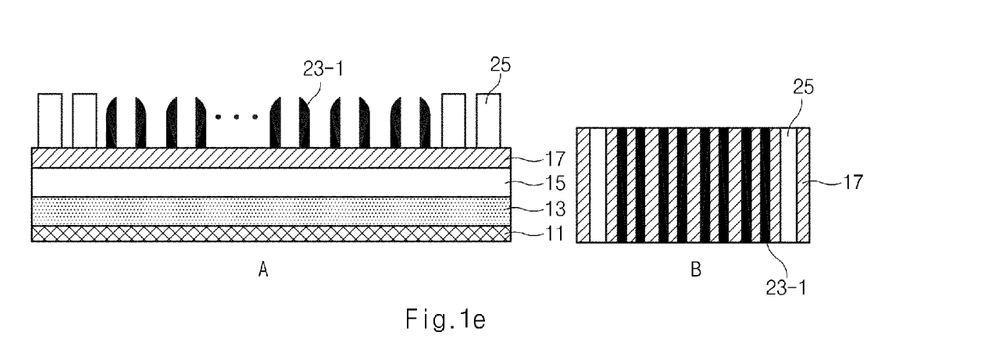

Referring to FIG. 1e, a third photoresist film (not shown) is formed over a substrate comprising the separated spacer patterns 23-1. A lithography process is performed on the third photoresist film (not shown) to form a pad mask pattern 25 for SSL or DSL in the peripheral circuit region.

Figure 1F:
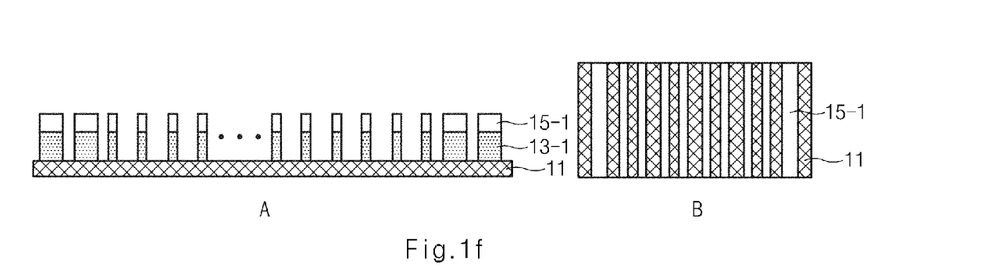

Referring to FIG. 1f, the first, second and third mask films 13, 15, 17 are etched with the spacer pattern 23-1 and the pad mask pattern 25 as etching masks until the underlying layer 11 is exposed, thereby obtaining a stack pattern including a first mask pattern 13-1 and a second mask pattern 15-1. The third mask film is removed by the etching process.

The lower underlying layer 11 is etched with the stack pattern as an etching mask to obtain a control word line pattern (not shown) of the NAND flash memory.

Figure 2:
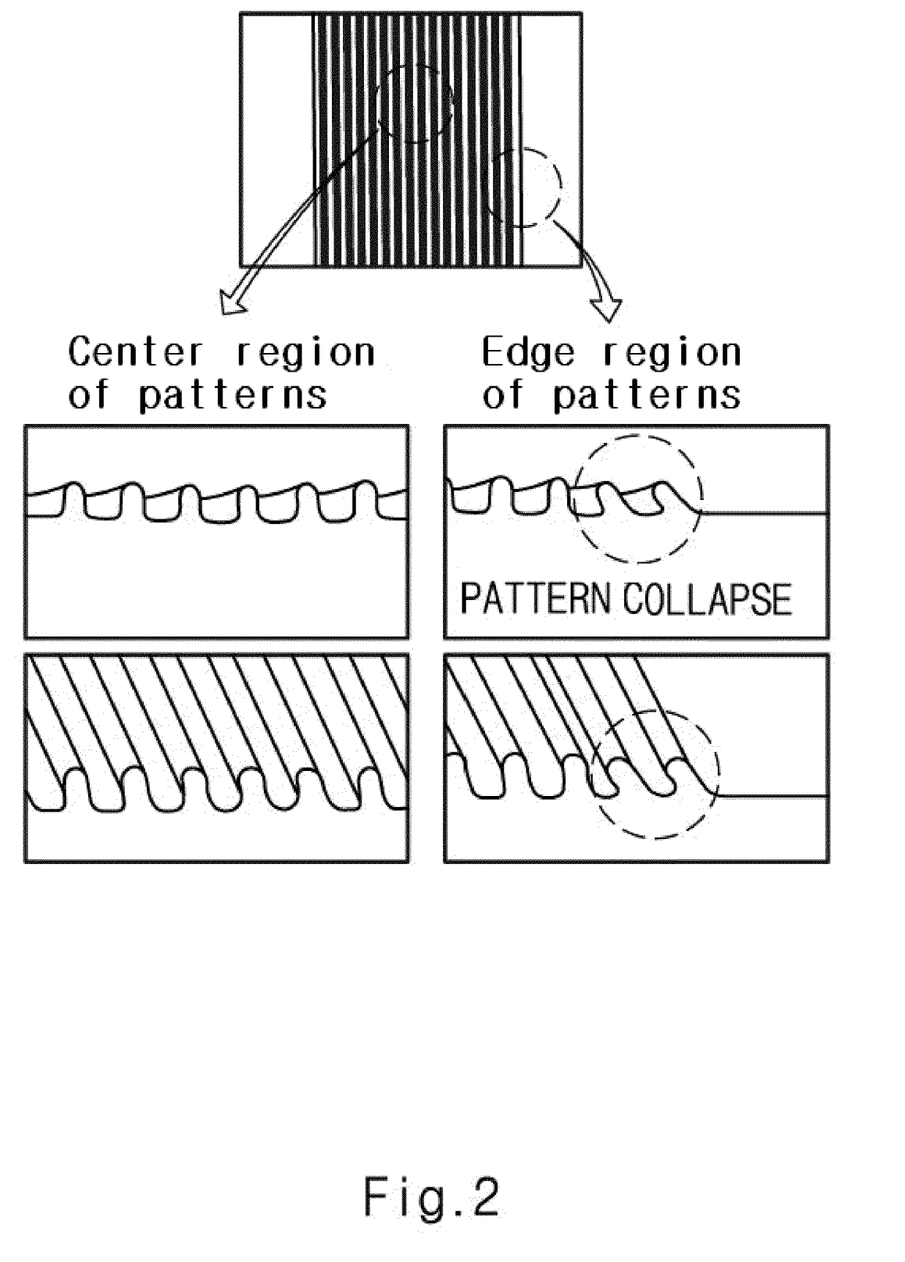
Figure 3:
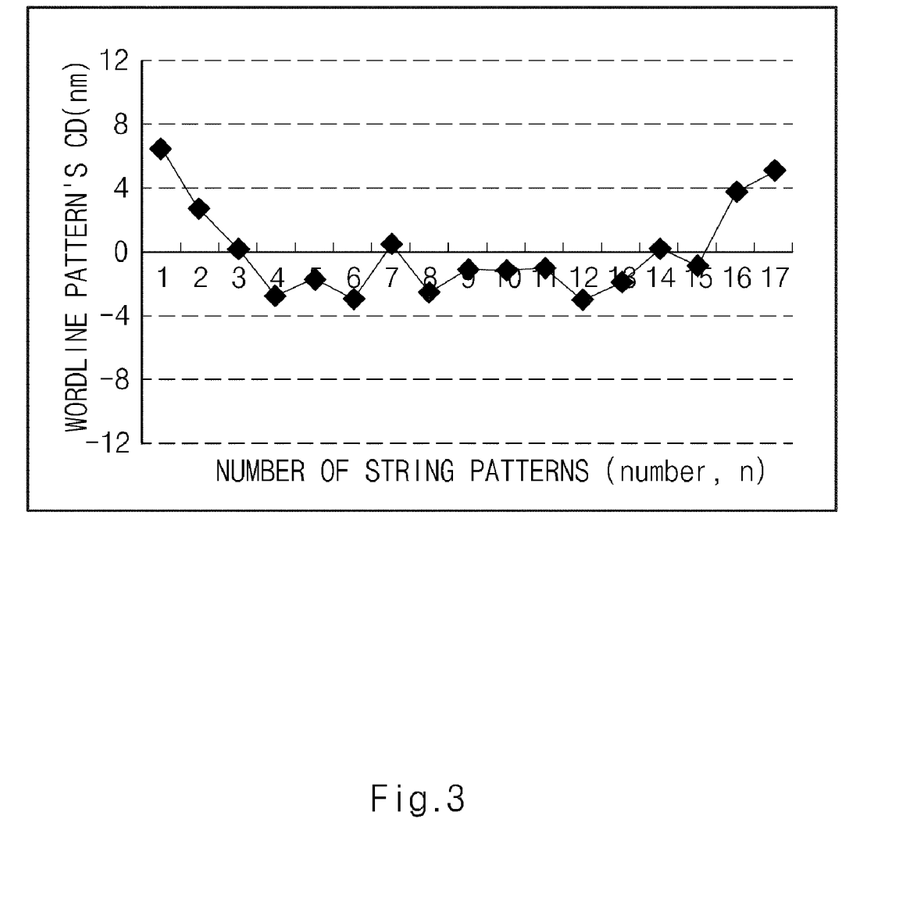
Figure 4:
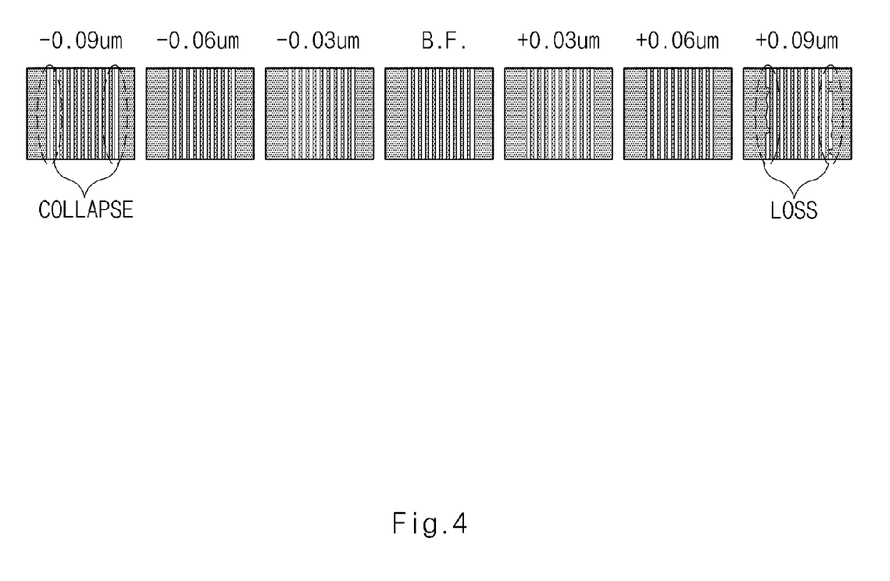
FIG. 4 is a diagram illustrating DOF depending on defocus of the pattern obtained by the conventional method.

It is difficult to control a critical dimension of a gate string pattern in a conventional method for fabricating a flash device. Specifically, in the conventional method, when a photoresist pattern for a word line is formed over a cell region, it is difficult to form a photoresist pattern having a uniform critical dimension due to a difference of a peripheral pattern density between photoresist patterns of the center region and photoresist patterns of the edge region in the cell region. That is, the photoresist pattern of the edge region is affected by a surface tension effect of a capillary force of a developing solution during a developing process for forming a photoresist pattern. As a result, the photoresist pattern is bent toward the center direction or collapsed as shown in FIG. 2. For example, the critical dimension of the edge string pattern (Nos. 13 and 17) has a difference of about 7 nm from the critical dimension (0 nm) of the center pattern (see FIG. 3). The edge pattern is weaker from defocus than the center pattern, so that a margin of the depth of focus (hereinafter, referred to as "DOF") is reduced to a range of 0±06 μm (see FIG. 4). As a result, a profile of the string pattern and the critical dimension uniformity are degraded during a subsequent etching process using the photoresist pattern as an etching mask.

Meanwhile, the height of the spacer pattern used as an etching mask when lower films are etched is determined by the height of the photoresist pattern. In order to perform the simplified spacer patterning method smoothly, the height of the photoresist pattern is required to be higher. However, the edge photoresist pattern is bent, so that the critical dimension difference is increased and DOF of the string is reduced.

BRIEF SUMMARY OF THE INVENTION

Various embodiments of the disclosure relate to a method for forming a pattern of a semiconductor device that comprises forming a dummy pattern, which is not used in an actual device operation, over a peripheral circuit region when a photoresist pattern for a word line is formed in a cell region. As a result, the edge photoresist pattern of the cell region can be prevented from being bent, and a critical dimension difference between the photoresist patterns of the center region and the edge region can be prevented from being generated.

According to an embodiment of the invention, a method for forming a pattern of a semiconductor device comprises: forming a mask film and a first photoresist film over an underlying layer of a substrate that includes a cell region and a peripheral circuit region; first patterning the first photoresist film to form a first photoresist pattern over the cell region and a dummy pattern over the peripheral circuit region; forming a spacer at sidewalls of the first photoresist pattern and the dummy pattern; removing the first photoresist pattern and the dummy pattern to form a spacer pattern over the cell region; coating a second photoresist film over the substrate including the spacer pattern; second patterning the second photoresist film to form a second photoresist pad pattern over the peripheral circuit region; and etching the mask film with the spacer pattern of the cell region and the second photoresist pad pattern of the peripheral circuit region as etching masks until the underlying layer is exposed, thereby forming a mask pattern.

Preferably, the mask film is a stack mask films including first, second and third mask films. The first mask film is an insulating film, the second mask film is an amorphous carbon film, and the third mask film is a silicon oxide nitride film, a polysilicon layer or an oxide film such as TEOS.

In one implementation, the first photoresist pattern has a first width and the dummy pattern has a second width, where the second width is at least twice that of the first width. In another implementation, the second width is at least three times that of the first width.

Preferably, the method further comprises forming an antireflection film over the mask film before forming the first photoresist film. In this case, the method may further comprise patterning the antireflection film with the first photoresist pattern as an etching mask before forming the spacer pattern.

Preferably, the first patterning process includes an exposing process performed with an exposure mask that includes a light transmitting region having a pitch twice larger than a device pitch and a light transmitting region for forming a dummy pattern in the peripheral circuit region; and a developing process. The exposing process and the developing process may be performed by a conventional method.

Preferably, the forming-a-spacer includes depositing an insulating film that can be deposited at a temperature range where the pattern profile is not degraded over the first photoresist pattern, for example, at a temperature ranging from 20 to 170° C., and performing an etch-back process until the upper region of the first photoresist pattern is exposed. The insulating film comprises an oxide film, a nitride film or a polysilicon film.

Preferably, the removing-the-first-photoresist-pattern-and-the-dummy-pattern is performed by an $O_2$ plasma ashing process.

The spacer pattern has an end portion connected with a "⊂" shape. After the spacer pattern is formed, a photoresist pattern that selectively exposes the "⊂" shaped end portion of the spacer pattern is formed over the substrate comprising the spacer pattern before the second photoresist pattern is coated. The end portion of the spacer pattern is etched with the photoresist pattern as an etching mask to separate the space patterns.

A process for performing each step of the disclosed method is lo performed by a general spacer patterning technology. While the end portion of the spacer pattern is removed, a page buffer or a decoder circuit pattern of the peripheral circuit region may be removed.

As mentioned above, the disclosed method changes a simple layout without any additional complicated process to improve the shortcomings of the prior art. That is, when the first photoresist pattern for a word line is formed in the cell region of the NAND flash memory device, a dummy pattern which is not used in an actual device operation is additionally formed over the peripheral circuit region, so that peripheral pattern density conditions of the photoresist pattern formed in the center region and the edge region of the cell region can be configured to be the same. As a result, the edge photoresist pattern can be prevented from being damaged or collapsed by a capillary force of a developing solution during the developing process for forming the photoresist pattern, thereby reducing a critical dimension difference of the photoresist patterns on the center region and the edge region. Moreover, the disclosed method may secure a margin of DOF of the string pattern for defocus, thereby obtaining a reliable semiconductor device.

BRIEF DESCRIPTION OF THE DRAWINGS

FIG. 2 is a diagram illustrating the center region and the edge region of the pattern of FIG. 1a.

FIG. 3 is a graph illustrating a critical dimension of the entire string pattern of FIG. 1a.

FIG. 6 is a diagram illustrating the center region and the edge region of the pattern of FIGS. 1a and 5a.

FIG. 7 is a graph illustrating a critical dimension of the entire string pattern of FIGS. 1a and 5a.

DESCRIPTION OF SPECIFIC EMBODIMENTS

FIGS. 5a to 5f are diagrams illustrating a method for forming a pattern of a semiconductor device according to an embodiment of the disclosure.

Figure 5A:
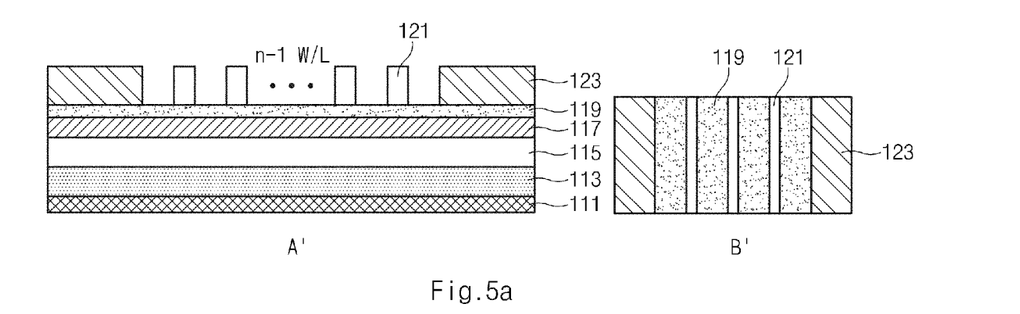
FIGS. 5a to 5f are diagrams illustrating a method for forming a pattern of a semiconductor device according to an embodiment of the disclosure.

Referring to FIG. 5a, an underlying layer 111 that includes a dielectric film [e.g., oxide-nitride-oxide film (ONO)] (not shown), a gate polysilicon layer (not shown), a tungsten conductive layer (not shown), a capping oxide film (not shown) and a gate mask film (not shown) is formed over a substrate including a device isolation film (ISO).

A multi-layered stack mask film that includes a first mask film 113, a second mask film 115 and a third mask film 117, and an antireflection film 119 are sequentially deposited over the underlying layer. The first mask film is formed with an oxide film. The second mask film is formed with an amorphous carbon layer. The third mask film is formed with a silicon oxide nitride film, a polysilicon layer and an oxide film such as TEOS. The type of antireflection film can be selected depending on a stack material of the second and third mask films.

A first photoresist film (not shown) is formed over the antireflection film 119. Since the first photoresist film is an important film to determine a height of a spacer pattern in a subsequent spacer patterning process, the first photoresist film may be formed to a given height or more. For example, the first photoresist pattern is formed to have a height ranging from about 1000 to 2000 Å.

A first photolithography process is performed on the first photoresist film to form a first photoresist pattern 121 in a cell region and a dummy pattern 123 in a peripheral circuit region.

The first photolithography process includes an exposing process and a developing process. The exposing process is performed with an exposure mask (not shown) that has a light transmission region having a pitch twice larger than a device pitch. The exposure mask also has a light transmitting region for forming a dummy pattern in a peripheral circuit region during the first photolithography process. Then, the developing process is performed. The exposing and developing processes may be performed by a conventional method.

In the case of a 30 nm device, if an etching bias is not considered, the width of the cell region where the photoresist pattern is formed is about 30 nm, and the width of the peripheral circuit region (space region) where the dummy pattern is formed is about 90 nm (line region width to space region width ratio=1:3). The critical dimension width of the first photoresist pattern formed in the cell region is the same as the separation width between the first photoresist pattern 121 and the dummy pattern 123. When the number of final word lines is $2n$, the first photoresist pattern 121 has n-1 protrusions (n is a number ranging from 5 to 20, e.g., n=8 or 16).

Figure 5B:
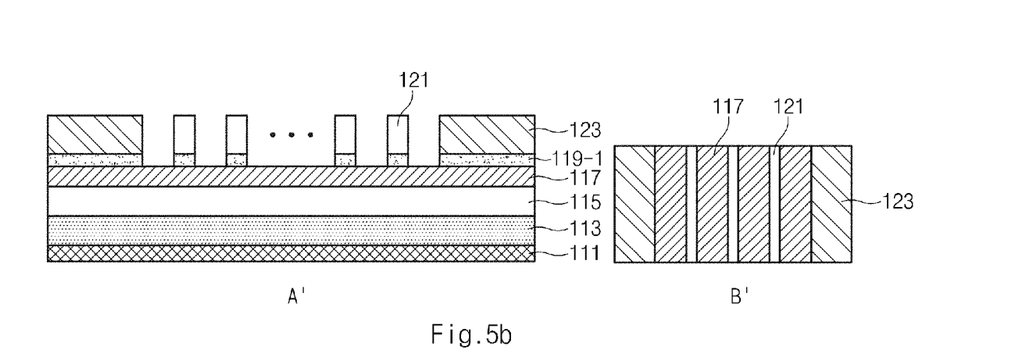

Referring to FIG. 5b, the antireflection film 119 is etched with the first photoresist pattern 121 and the dummy pattern 123 as etching masks, thereby obtaining a first stack pattern including an antireflection pattern 119-1 and the first photoresist pattern 121 and a second stack pattern including the antireflection pattern 119-1 and the dummy pattern 123.

Figure 5C:
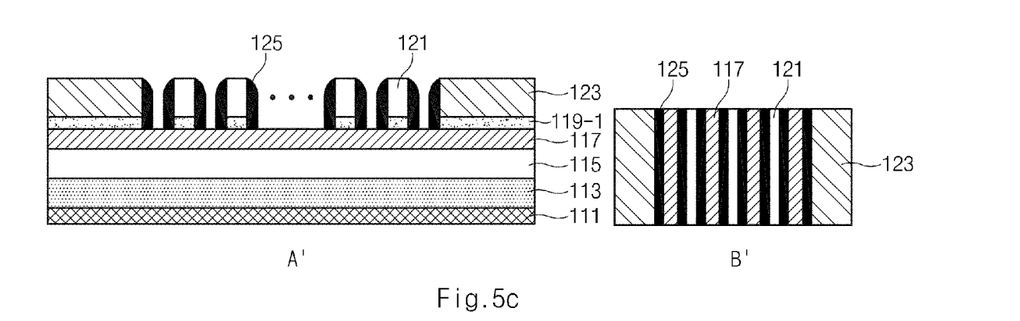

Referring to FIG. 5c, a spacer material (not shown) is deposited over the substrate comprising the first and second stack patterns. An etch-back process is performed on the spacer material to form a spacer 125 at sidewalls of the first and second stack patterns. That is, a spacer is formed at a sidewall of the dummy pattern 123 facing the cell region.

For the spacer material, a material may be used that can be uniformly deposited with an excellent step coverage without changing a profile of the lower stack pattern and deposited at a temperature lower than a deposition temperature of lower materials to prevent film lifting by heat. For example, the material may include an oxide film, a nitride film or a polysilicon film which can be deposited at a temperature ranging from 20 to 170° C.

Figure 5D:
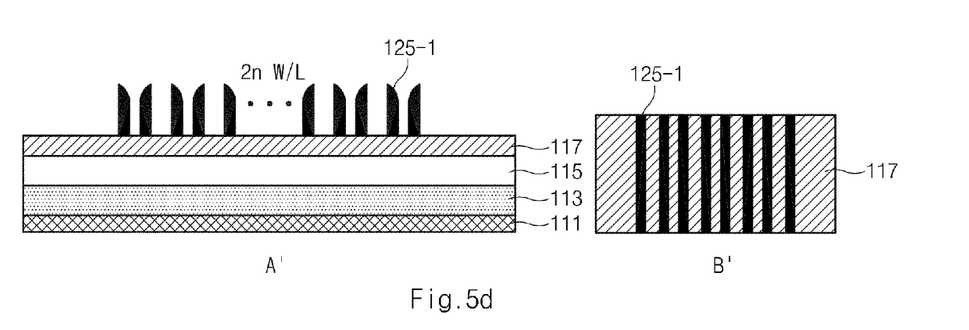

Referring to FIG. 5d, an $O_2$ plasma ashing process is performed on the first and second stack patterns and the dummy pattern to which the spacer is formed to remove the first and second stack patterns and the dummy pattern, thereby obtaining $2n$ (n is a number ranging from 5 to 20, e.g., n=8 or 16) spacer patterns 125-1.

A second photoresist pattern (not shown) that exposes the end portion of the spacer pattern 125-1 is formed. An etching process (not shown) is performed on the exposed end portion of the spacer pattern 125-1 to separate the end portion of the spacer pattern 125-1 with an etching mask.

Figure 5E:
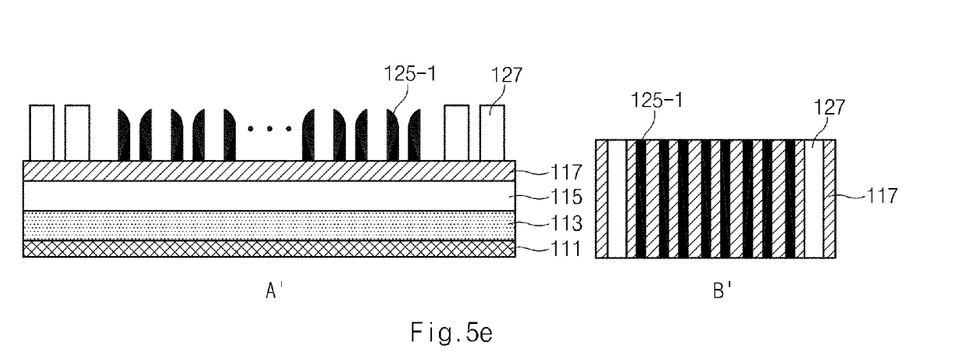

Referring to FIG. 5e, a third photoresist film is formed over the spacer pattern 125-1 having the separated end portion. A second lithography process is performed on the third photoresist film to form a pad mask pattern 127 for SSL or DSL in a peripheral circuit region of the spacer pattern 125-1.

Figure 5F:
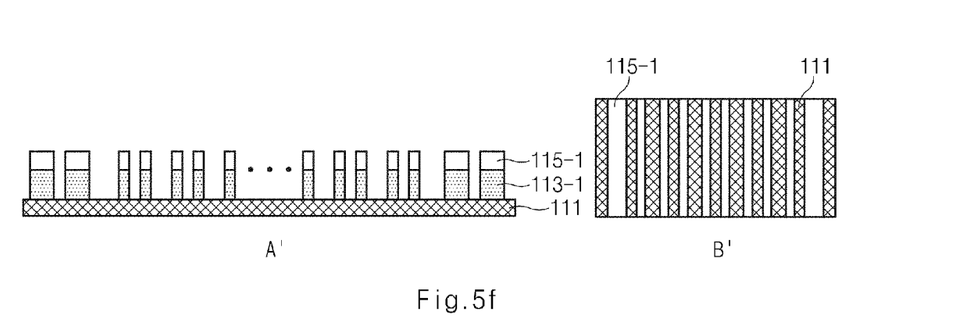

Referring to FIG. 5f, the first, second and third mask films 113, 115 and 117 are etched with the spacer pattern 125-1 and the pad mask pattern 127 as etching masks until the underlying layer 111 is exposed, thereby obtaining a stack pattern including a first mask pattern 113-1 and a second mask pattern 115-1. The third mask film 117 is removed by the etching process.

Then, the lower underlying layer 111 is etched with the stack pattern as an etching mask, thereby obtaining a control gate pattern of a NAND flash memory.

Figure 6:
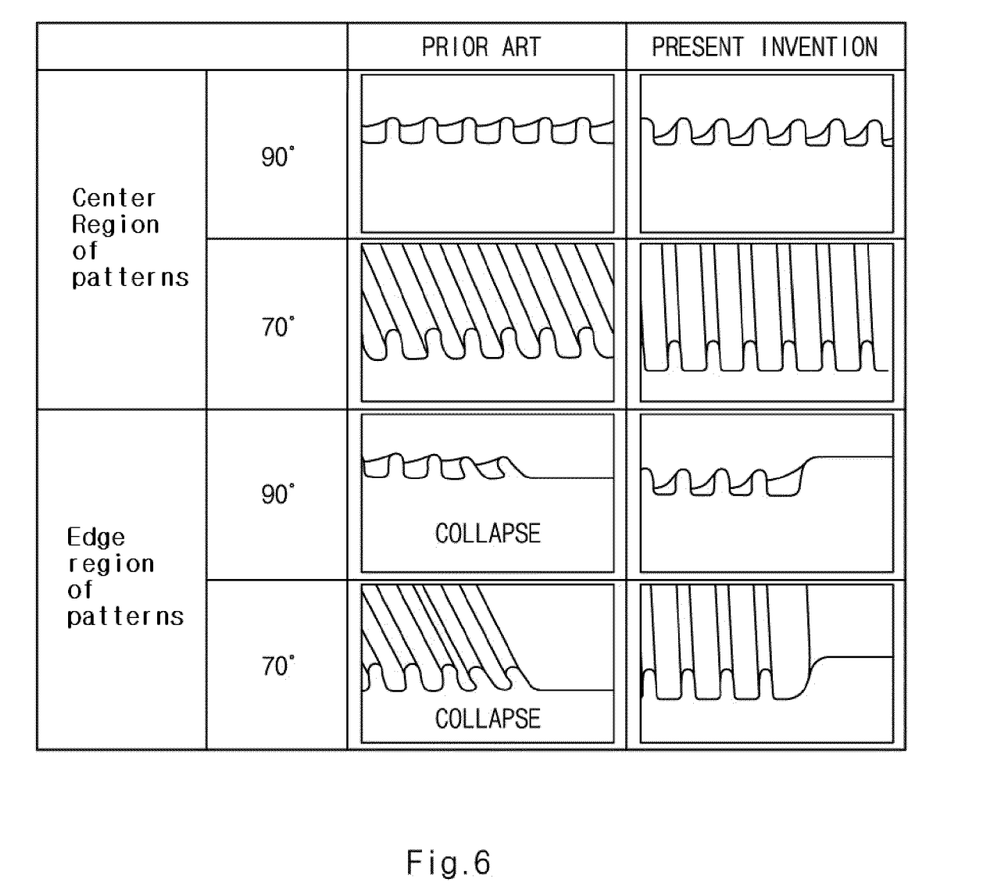
Figure 7:
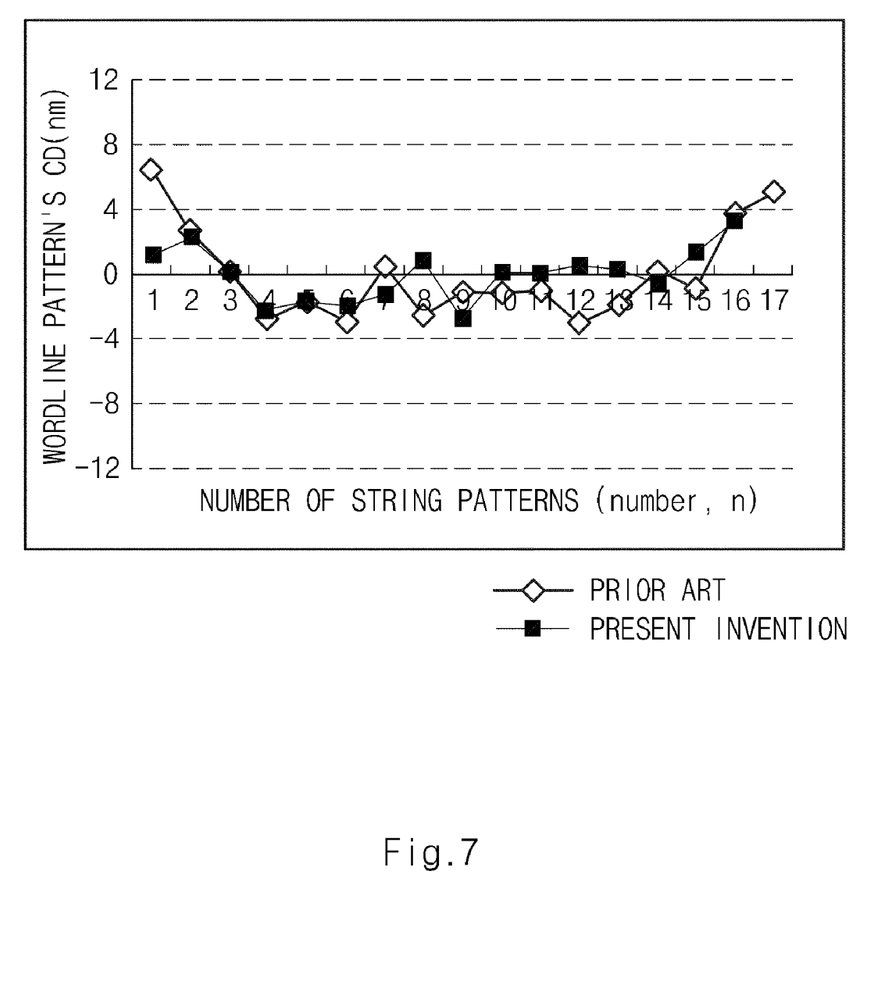
Figure 8:
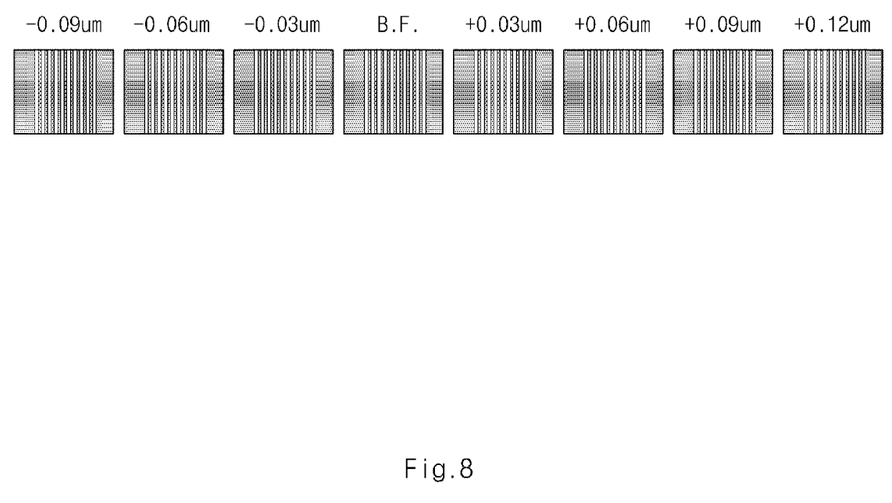
FIG. 8 is a diagram illustrating DOF depending on defocus of the pattern obtained by the disclosed method.

Since the space between the dummy pattern and photoresist pattern is the same as the space between each photoresist patterns, the same capillary force is applied to the photoresist patterns formed in the center region and in the edge region during the developing process. As shown in FIG. 6, the edge photoresist pattern of the cell region can be prevented from being bent toward the center direction, thereby improving the conventional shortcoming where the pattern may collapse or break off. As a result, a critical dimension difference between the edge string pattern and the center pattern can be reduced (see FIG. 7). Since the margin range of DOF of the edge pattern is expanded (see FIG. 8), the disclosed method may prevent a profile of the edge pattern from being lowered in a subsequent etching process using the photoresist pattern as an etching mask, and a critical dimension from being enlarged.

As described above, the disclosed method enables formation of a pattern for a word line having an excellent profile, thereby obtaining a reliable semiconductor device.

The above embodiments of the disclosure are illustrative and not limitative. Various alternatives and equivalents are possible. The invention is not limited by the type of deposition, etching polishing, and patterning steps describe herein. Nor is the invention limited to any specific type of semiconductor device. For example, the disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a pattern of a semiconductor device, the method comprising:
   providing a substrate having a cell region and a peripheral circuit region, the substrate having an underlying layer disposed over the cell region and the peripheral region;
   forming a mask film and a first photoresist film over the underlying layer of the substrate, the first photoresist film being disposed over the mask film;
   patterning the first photoresist film to form a first photoresist pattern having a first width in the cell region and a dummy pattern having a second width in the peripheral circuit region, wherein the second width is at least two times larger than the first width, and a space between the dummy pattern and the first photoresist pattern that is adjacent to the dummy pattern is substantially the same as a space between two adjacent first photoresist patterns;
   forming a spacer over sidewalls of the first photoresist pattern and the dummy pattern;
   removing the first photoresist pattern and the dummy pattern to form a spacer pattern in the cell region;
   forming a second photoresist film over the substrate including the spacer pattern;
   patterning the second photoresist film to form a photoresist pad pattern in the peripheral circuit region; and
   etching the mask film using the spacer pattern of the cell region and the photoresist pad pattern of the peripheral circuit region as etch masks at least until the underlying layer is exposed, thereby forming a mask pattern.

2. The method according to claim 1, wherein the mask film includes a first mask film, a second mask film and a third mask film.

3. The method according to claim 2, wherein the first mask film includes an insulating film, the second mask film includes an amorphous carbon film, and the third mask film includes a film selected from the group consisting of a silicon oxide nitride film, a polysilicon layer, and an oxide film.

4. The method according to claim 1, further comprising forming an antireflection film over the mask film before forming the first photoresist film.

5. The method according to claim 4, further comprising:
   patterning the antireflection film using the first photoresist pattern and the dummy pattern as etch masks before forming the spacer.

6. The method according to claim 1, wherein the mask pattern is a pattern for a word line.

7. The method according to claim 1, further comprising patterning the antireflection film using the first photoresist pattern and the dummy pattern as etch masks before forming the spacer.

8. The method according to claim 1, wherein the performing of the first patterning process includes:
   performing an exposing process using a cell exposure mask that includes a light transmitting region having a pitch about two times larger than a device pitch and a light transmitting region for forming the dummy pattern; and
   performing a developing process.

9. The method according to claim 1, wherein the forming of the spacer includes:
   depositing an insulating film over the first photoresist pattern and the dummy pattern at a temperature ranging from about 20 to 170° C.; and
   performing an etch-back process on the insulating film until an upper region of the first photoresist pattern is exposed.

10. The method according to claim 1, wherein the removing of the first photoresist pattern and the dummy pattern includes an $O_2$ plasma ashing process.

11. The method of claim 1, wherein the second width is three times larger than the first width.

12. A method for forming a pattern of a semiconductor device, the method comprising:
   providing a substrate that includes a cell region and a peripheral circuit region, the substrate including an underlying layer overlying the cell region and the peripheral circuit region, a mask film over the underlying layer, an antireflection film over the mask film, and a first photoresist film over the antireflection film;
   patterning the first photoresist film to form a first photoresist pattern having a first width in the cell region and a dummy pattern having a second width in the peripheral circuit region, wherein the second width is at least two times larger than the first width, and a space between the dummy pattern and the first photoresist pattern that is adjacent to the dummy pattern is substantially the same as a space between two adjacent first photoresist patterns;
   forming a spacer at sidewalls of the first photoresist pattern and the dummy pattern;
   removing the first photoresist pattern and the dummy pattern to form a spacer pattern in the cell region;
   forming a second photoresist film over the substrate including the spacer pattern;
   patterning the second photoresist film to form a photoresist pad pattern in the peripheral circuit region; and
   etching the mask film using the spacer pattern of the cell region and the photoresist pad pattern of the peripheral circuit region as etch masks to form a mask pattern, the mask pattern exposing portions of the underlying layer.

13. The method according to claim 12, further comprising patterning the antireflection film using the first photoresist pattern and the dummy pattern as etch masks before forming the spacer.

14. The method according to claim 12, wherein the mask film includes a first mask film, a second mask film, and a third mask film.

15. The method according to claim 14, wherein the first mask film includes an insulating film, the second mask film includes an amorphous carbon film, and the third mask film includes a film selected from the group consisting of a silicon oxide nitride film, a polysilicon layer, and an oxide film.

16. The method according to claim 12, wherein the mask pattern is a pattern for a word line.

17. The method according to claim 12, wherein the first patterning process includes:
   an exposing process performed with a cell exposure mask that includes a light transmitting region having a pitch about two times larger than a device pitch and a light transmitting region for forming the dummy pattern; and
   a developing process.

18. The method according to claim 12, wherein the forming of the spacer includes:
   depositing an insulating film over the first photoresist pattern and the dummy pattern at a temperature ranging from about 20 to 170° C.; and
   performing an etch-back process on the insulating film until an upper region of the first photoresist pattern is exposed.

19. The method according to claim 12, wherein the removing of the first photoresist pattern and the dummy pattern includes an $O_2$ plasma ashing process.

20. The method according to claim 12, wherein the second width is three times larger than the first width.

* * * * *